(12) United States Patent
Nishinaka et al.

(10) Patent No.: US 12,032,038 B2
(45) Date of Patent: Jul. 9, 2024

(54) LOAD SHORT-CIRCUIT DETECTION METHOD AND LOAD SHORT-CIRCUIT DETECTION DEVICE

(71) Applicant: Panasonic Intellectual Property Management Co., Ltd., Osaka (JP)

(72) Inventors: Masaya Nishinaka, Kanagawa Ken (JP); Hisashi Senga, Kanagawa Ken (JP)

(73) Assignee: PANASONIC AUTOMOTIVE SYSTEMS CO., LTD., Kanagawa (JP)

( * ) Notice: Subject to any disclaimer, the term of this patent is extended or adjusted under 35 U.S.C. 154(b) by 74 days.

(21) Appl. No.: 17/832,076

(22) Filed: Jun. 3, 2022

(65) Prior Publication Data

US 2023/0030557 A1 Feb. 2, 2023

(30) Foreign Application Priority Data

Jul. 30, 2021 (JP) .................................. 2021-124928

(51) Int. Cl.
*G01R 31/52* (2020.01)
*G01R 19/165* (2006.01)

(52) U.S. Cl.
CPC ....... *G01R 31/52* (2020.01); *G01R 19/16585* (2013.01)

(58) Field of Classification Search
CPC . G01R 31/52; G01R 31/005; G01R 19/16585
See application file for complete search history.

(56) References Cited

U.S. PATENT DOCUMENTS

2009/0315566 A1\* 12/2009 Thiim .................. G01R 19/252
324/551
2010/0254515 A1\* 10/2010 Lijima .................... H02M 1/32
378/112

(Continued)

FOREIGN PATENT DOCUMENTS

JP 2015-215205 12/2015
JP 2016-152724 8/2016

(Continued)

OTHER PUBLICATIONS

Notice of Allowance Issued in Corresponding JP Patent Application No. 2021-124928, dated Mar. 14, 2023, along with an English translation thereof.

(Continued)

*Primary Examiner* — Lee E Rodak
*Assistant Examiner* — Demetrius R Pretlow
(74) *Attorney, Agent, or Firm* — Greenblum & Bernstein, P.L.C.

(57) ABSTRACT

A load short-circuit detection method is a load short-circuit detection method executed in a load drive device including: a power storage element that stores electric power for driving a load; a first switch that is connected to a low-potential side of the load and controls a current flowing through the load; and a voltage detection circuit that detects a voltage of a current flow path flowing from the power storage element to a low-potential side power supply via the first switch. The load short-circuit detection method includes: PWM-driving the first switch at a predetermined duty ratio; and detecting that the load is being short-circuited in a case where a state in which the voltage of the current flow path detected by the voltage detection circuit is lower than or equal to a predetermined threshold voltage continues for a predetermined period of time or longer.

6 Claims, 6 Drawing Sheets

(56) References Cited

U.S. PATENT DOCUMENTS

| | | | | |
|---|---|---|---|---|
| 2011/0188163 A1* | 8/2011 | Ando | .................. | H03K 5/22 |
| | | | | 361/57 |
| 2013/0293270 A1* | 11/2013 | Lee | .................. | H02M 3/156 |
| | | | | 327/113 |
| 2014/0001836 A1* | 1/2014 | Basheer | .................. | B60L 50/51 |
| | | | | 307/9.1 |
| 2015/0168476 A1* | 6/2015 | Park | .................. | H03K 17/0822 |
| | | | | 324/549 |
| 2015/0326000 A1 | 11/2015 | Kanzaki et al. | | |
| 2016/0294178 A1* | 10/2016 | Ohki | .................. | H03K 17/0822 |
| 2018/0309283 A1* | 10/2018 | Hou | .................. | G01R 31/52 |
| 2020/0371149 A1* | 11/2020 | Malthaner | .................. | G01R 31/50 |
| 2021/0021121 A1* | 1/2021 | Lee | .................. | G01R 31/27 |
| 2021/0088598 A1* | 3/2021 | Maekawa | .................. | H03K 17/18 |
| 2021/0218360 A1* | 7/2021 | Ohara | .................. | H02P 29/024 |
| 2021/0231748 A1* | 7/2021 | Morishita | .................. | H02H 9/02 |
| 2021/0293897 A1* | 9/2021 | Yao | .................. | G01R 31/52 |

FOREIGN PATENT DOCUMENTS

| | | |
|---|---|---|
| JP | 2018-73908 | 5/2018 |
| JP | 2019-205037 | 11/2019 |
| JP | 2021-51010 | 4/2021 |
| WO | 2019/220716 | 11/2019 |

OTHER PUBLICATIONS

Japan Official Action receive in JP Application No. 2021-124928, dated Nov. 15, 2022.

* cited by examiner

US 12,032,038 B2

LOAD SHORT-CIRCUIT DETECTION METHOD AND LOAD SHORT-CIRCUIT DETECTION DEVICE

CROSS-REFERENCE TO RELATED APPLICATIONS

This application is based upon and claims the benefit of priority from Japanese Patent Application No. 2021-124928, filed on Jul. 30, 2021, the entire contents of which are incorporated herein by reference.

FIELD

The present disclosure relates to a load short-circuit detection method and a load short-circuit detection device.

BACKGROUND

Conventionally, control devices that drive a load by controlling a high-side switch and a low-side switch are known.

In this case, as methods to detect a short-circuit between terminals of a load, a method in which an abnormal current value is detected using a current monitoring circuit provided on a low-side switch side of a control device by driving the load at a high duty ratio and a method in which an abnormal voltage value is detected using a voltage monitoring circuit provided on a high-side switch side are proposed.

A conventional technique is disclosed in JP 2019-205037 A

However, in the conventional methods of detecting a short-circuit between terminals of a load, since the load is driven at a high duty ratio in a state where the terminals of the load are short-circuited, there is a concern that the control device, a harness, and the like may be overheated and deteriorated when a large current flows.

An object of the present disclosure is to reliably detect a load short-circuit and to protect components that may be located in a flow path through which a short-circuit current flows.

SUMMARY

A load short-circuit detection method according to an aspect of the present disclosure is a load short-circuit detection method executed in a load drive device including: a power storage element that stores electric power for driving a load; a first switch that is connected to a low-potential side of the load and controls a current flowing through the load; and a voltage detection circuit that detects a voltage of a current flow path flowing from the power storage element to a low-potential side power supply via the first switch. The load short-circuit detection method includes: PWM-driving the first switch at a predetermined duty ratio; and detecting that the load is being short-circuited in a case where a state in which the voltage of the current flow path detected by the voltage detection circuit is lower than or equal to a predetermined threshold voltage continues for a predetermined period of time or longer.

DETAILED DESCRIPTION

Hereinafter, embodiments of the present invention will be described with reference to the drawings.

Figure 1:
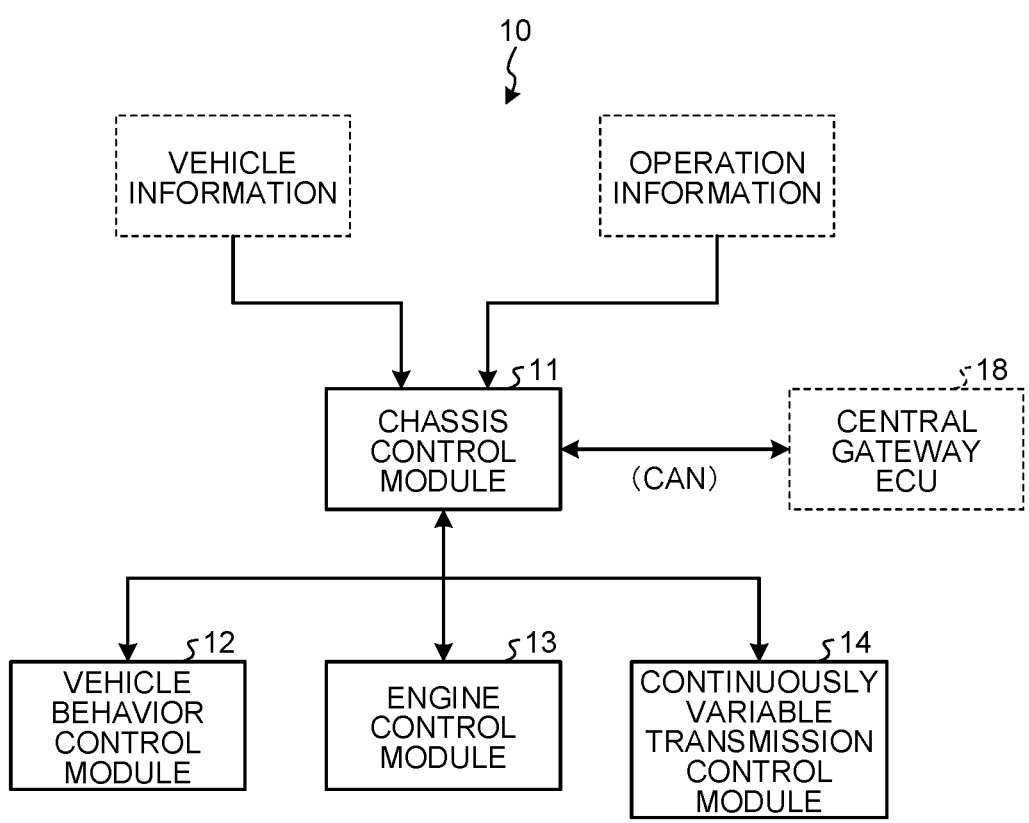
FIG. 1 is a schematic configuration block diagram of an in-vehicle system to which a control device of a vehicle actuator according to an embodiment is applied.

FIG. 1 is a schematic configuration block diagram of an in-vehicle system to which a control device of a vehicle actuator according to an embodiment is applied.

In an in-vehicle system 10 of FIG. 1, a case where a chassis control module 11 is configured as a control device of a vehicle actuator will be described as an example.

The chassis control module 11 controls a vehicle behavior control module 12 that performs vehicle behavior control such as a skid prevention function, an engine control module 13 that performs engine control, and a continuously variable transmission control module 14 that performs continuously variable transmission (CVT) control on the basis of input vehicle information (such as the vehicle speed, the wheel speed, longitudinal and lateral accelerations, the steering angle, or driving force information) and operation information such as the steering operation state, the accelerator operation state, or the brake operation state).

In this case, the chassis control module 11 is caused to perform cooperative operation with other control modules (not illustrated) via a central gateway ECU 18, specifically, a power train control module, a body control module, a (autonomous) driving assistance control module, a multimedia control module, and the like.

Figure 2:
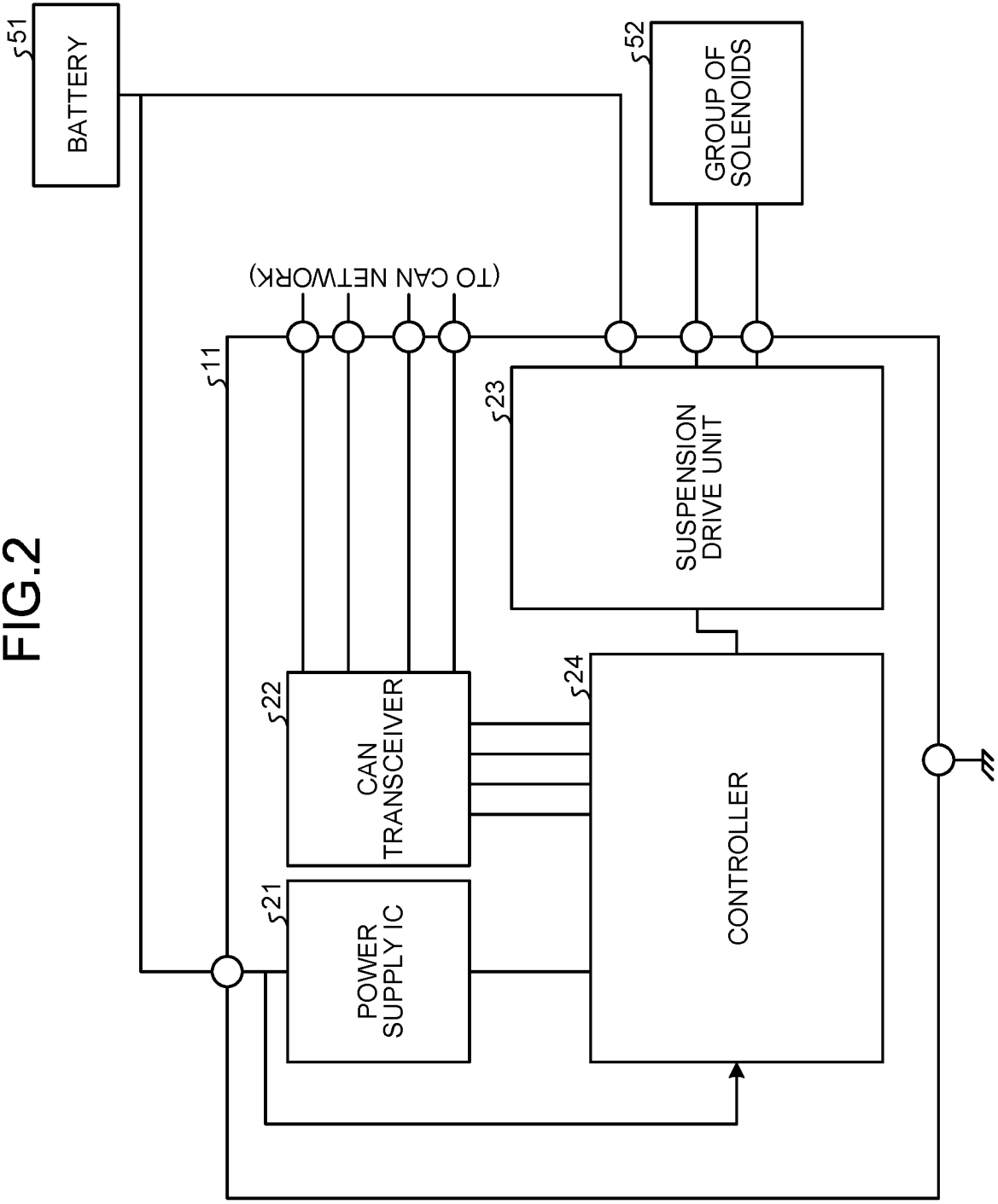
FIG. 2 is a schematic configuration block diagram of the main part of a chassis control module.

FIG. 2 is a schematic configuration block diagram of the main part of the chassis control module.

In FIG. 2, a case where the chassis control module 11 performs drive control of a suspension is described as an example.

In electronically controlled suspension control, a solenoid type electronic control valve is used to change the damping force of a shock absorber, and the amount of oil flowing through the solenoid type electronic control valve is controlled. Specifically, for example, increasing the current flowing through the solenoid causes the solenoid type electronic control valve to be closed, thereby making it difficult for the oil to flow and hardening the shock absorber, which reduces the damping force.

Meanwhile, reducing the current flowing through the solenoid causes the solenoid type electronic control valve to be opened, thereby making it easier for the oil to flow and softens the shock absorber, which increases the damping force.

Then, by performing this control independently for each of the four wheels, the damping force of each of the shock absorbers is controlled so as to keep the vehicle body horizontal.

As illustrated in FIG. 2, the chassis control module 11 includes a power supply IC 21 that converts power supplied from a (in-vehicle) battery 51 and supplies power to each of units of the chassis control module 11, a CAN transceiver 22 that communicates with each of units of the vehicle including the central gateway ECU 18, a suspension drive unit 23 that drives solenoids of a plurality of solenoid type electronic valves included in a suspension to be controlled, and a controller 24 that controls the entire chassis control module 11 while communicating with each of the units of the vehicle via the CAN transceiver 22.

In the above configuration, the controller 24 receives power supply from the power supply IC 21 and performs suspension drive control as chassis control in cooperation with other control modules via the CAN transceiver 22, a CAN network, and the central gateway ECU 18.

Figure 3:
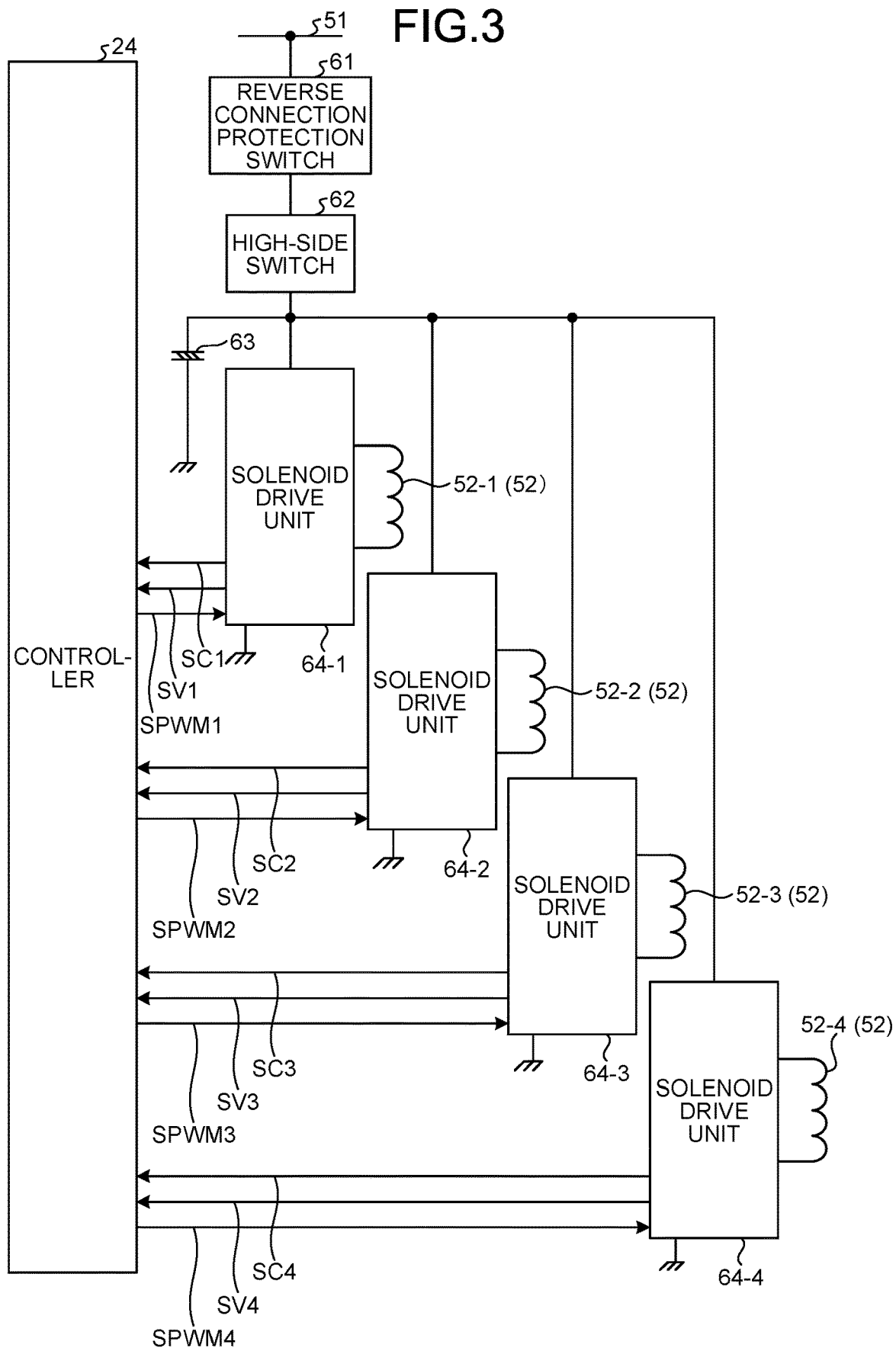
FIG. 3 is a schematic configuration block diagram of a suspension drive unit.

FIG. 3 is a schematic configuration block diagram of the suspension drive unit.

The suspension drive unit 23 includes a reverse connection protection switch 61 having one end connected to a suspension drive power supply, a high-side switch 62 which has one end connected to the other end of the reverse connection protection switch 61 and to which an on/off control signal SCO is input from the controller 24 and functions as a cutoff switch (second switch), and an electrolytic capacitor 63 which has one end connected to the other end of the high-side switch 62 and the other end grounded and suppresses a supply current.

The suspension drive unit 23 further includes a plurality of (in the example of FIG. 3, four) solenoid drive units 64-1 to 64-4 each of which has one end connected to the other end of the high-side switch and the other end grounded and which output current detection signals SC1 to SC4 and voltage detection signals SV1 to SV4, respectively, and perform drive control of solenoids 52-1 to 52-4 each included in a shock absorber of a corresponding wheel on the basis of PWM control signals SPWM1 to SPWM4 from the controller 24.

Next, configurations of the solenoid drive units 64-1 to 64-4 will be described.

In this case, since the solenoid drive units 64-1 to 64-4 have the same configuration, the solenoid drive unit 64-1 will be described as an example.

Figure 4:
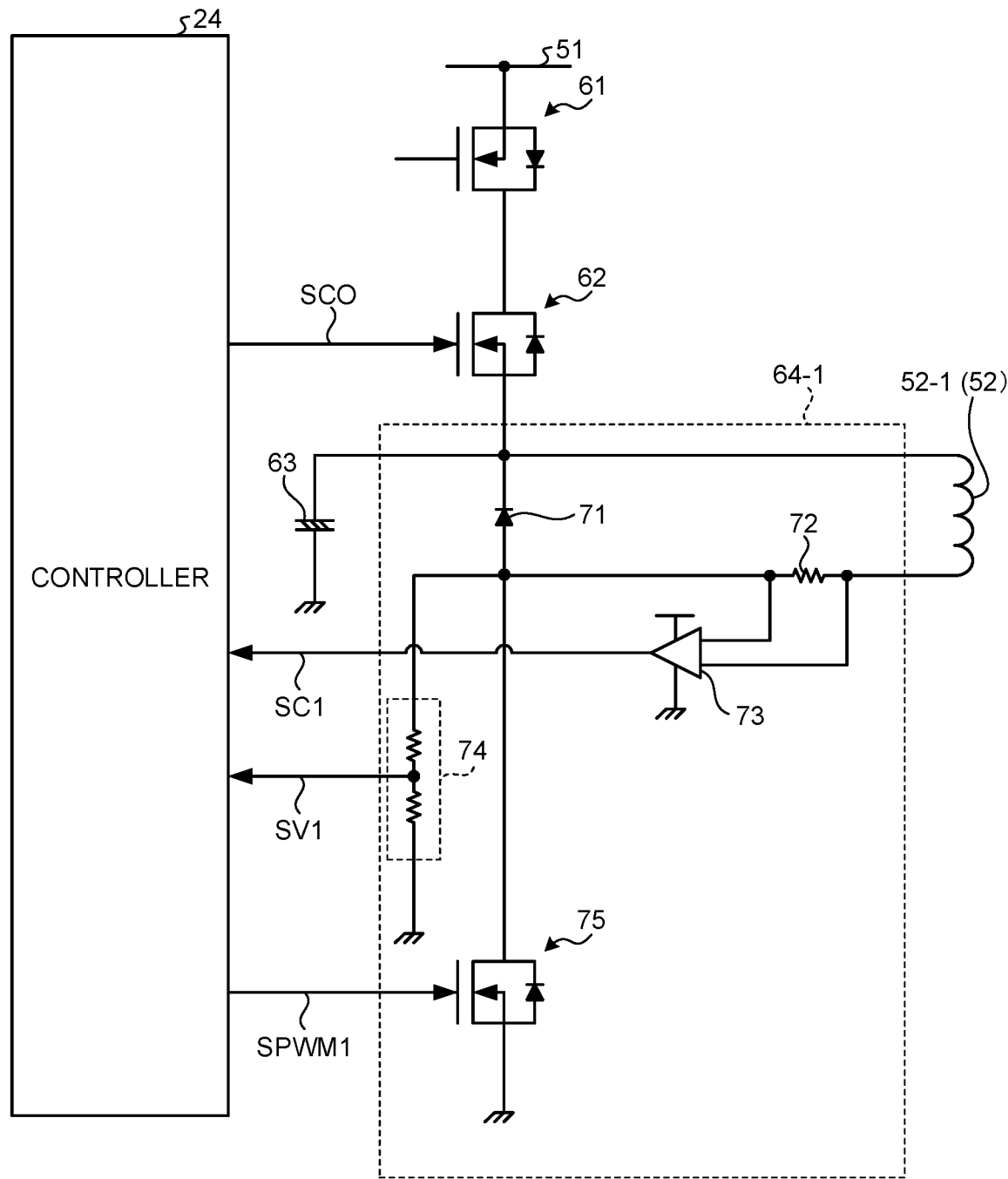
FIG. 4 is a detailed explanatory diagram of a solenoid drive unit.

FIG. 4 is a detailed explanatory view of the solenoid drive unit.

A solenoid drive unit 34-1 includes a protection diode 71 which has a cathode terminal connected to the other end of the high-side switch 62 and protects the solenoid 52-1 from a counter electromotive force, a shunt resistor 72 for current detection which has one end connected to the other end of the solenoid 52-1 connected to the other end (source terminal) of the high-side switch 62 and the other end connected to an anode terminal of the protection diode 71, and a current detection operational amplifier 73 input to the both ends of the shunt resistor.

The solenoid drive unit 34-1 further includes a voltage detection circuit 74 which has voltage dividing resistors connected in series, an input terminal connected to the anode terminal of the protection diode 71, and an output terminal connected to an analog input terminal of the controller 24, and a low-side switch 75 which has one end connected to the anode terminal of the protection diode 71 and the other end grounded, receives the PWM control signal SPWM1 from the controller 24, and functions as a PWM drive unit (first switch).

Here, the ground corresponds to a low-potential side power supply.

In the above configuration, when the low-side switch 75 is transitioned from an ON state to an OFF state, the protection diode 71 prevents generation of a large inrush current due to generation of a counter electromotive force in the coil of the solenoid 52-1, thereby preventing the solenoid 52-1 or the shunt resistor 72 from being damaged.

In the example of FIG. 4, to facilitate understanding, the reverse connection protection switch 61, the high-side switch 62, and the low-side switch 75 are each illustrated by one N-channel MOS transistor; however, it is also possible to provide a plurality of N-channel MOS transistors in parallel depending on the current capacity.

Moreover, the current detection operational amplifier 73 detects the current flowing through the solenoid 52-1 on the basis of the voltage generated in the shunt resistor 72 when the low-side switch 75 is in the on-state and outputs the current detection signal SC1 to the controller 24.

The voltage detection circuit 74 outputs the voltage detection signal SV1 corresponding to the voltage applied to the solenoid 52-1 to the controller 24.

The low-side switch 75 is turned on or off at a duty ratio corresponding to the PWM control signal SPWM1 output from the controller 24 and controls the amount of current flowing through the solenoid 52-1, thereby performing drive control of the solenoid 52-1.

Next, with respect to the operation of the embodiment, load short-circuit diagnosis processing at the time of initial diagnosis of the vehicle will be described using the solenoid drive unit 34-1 as an example.

At the time of starting the vehicle, in order to ensure safety at the time of starting and to protect in-vehicle devices, load short-circuit diagnosis processing of diagnosing whether or not a load is short-circuited is performed in addition to a power source short-circuit diagnosis and a ground fault diagnosis.

Figure 5:
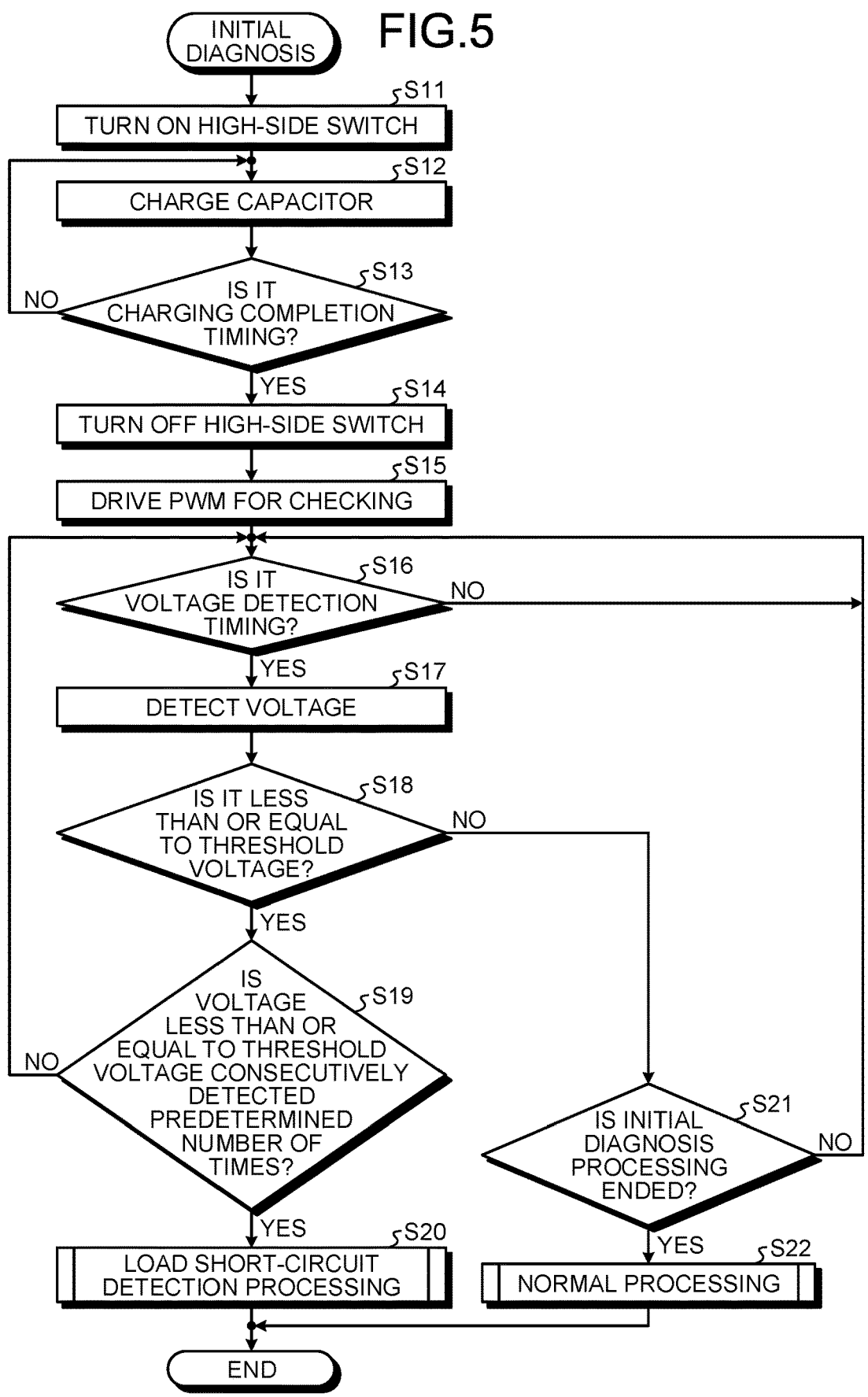
FIG. 5 is a processing flowchart of load short-circuit diagnosis processing in initial diagnosis.

FIG. 5 is a processing flowchart of the load short-circuit diagnosis processing in initial diagnosis.

In the initial state, it is based on the premise that the reverse connection protection switch 61, the high-side switch 62, and the low-side switch 75 are in the OFF state.

When the load short-circuit diagnosis processing is started, first, the controller 24 outputs an on/off control signal SCO of an "H" level to a gate terminal of the N-channel MOS transistor included in the high-side switch in order to turn on the high-side switch 62 that functions as a cutoff switch in order to charge the electrolytic capacitor 63.

As a result, when the on/off control signal SCO of the "H" level is input from the controller 24, the high-side switch 62 transitions to the ON state (step S11).

As a result, electric power is supplied from the battery 51 to the electrolytic capacitor 63 via a parasitic diode of the reverse connection protection switch 61 and the high-side switch 62, thereby starting charging (step S12).

Subsequently, the controller 24 determines whether or not charging completion timing, at which the voltage of the electrolytic capacitor 63 becomes equal to the voltage of the battery 51, has been reached since the start of charging (step S13).

If it is determined in step S13 that the charging completion timing has not yet been reached (step S13; No), the processing proceeds to step S12 again, and charging of the electrolytic capacitor 63 is continued.

In a case where it is determined in step S13 that the charging completion timing has been reached (step S; Yes), the controller 24 outputs an on/off control signal SCO of an "L" level to the gate terminal of the N-channel MOS transistor included in the high-side switch 62 in order to turn off the high-side switch 62 that functions as a cutoff switch (step S14).

As a result, the controller 24 stands by until the high-side switch 62 is reliably turned off.

Then, the controller 24 outputs the PWM control signal SPWM1 for driving the low-side switch 75 at a predetermined duty ratio for detecting a load short-circuit to a gate terminal of the N-channel MOS transistor included in the low-side switch 75.

Here, the predetermined duty ratio is set to a value with which it is possible to reliably detect that the solenoid 52-1 as a load is being short-circuited with high accuracy and to protect components in a current flow path from the high-potential side power supply and the electrolytic capacitor 63 to the ground (low-potential side power supply) (in the example of FIG. 4, the shunt resistor 72 and the low-side switch 75) from overcurrent.

More specifically, the duty ratio is 50% or less, and more preferably, about 5%. However, it is not limited to this, and the duty ratio is set depending on the circuit configuration as appropriate.

Subsequently, the controller 24 determines whether or not predetermined voltage detection timing has been reached (step S16).

In this case, the predetermined voltage detection timing is set to, for example, every 10 msec by an internal timer of the controller 24.

If it is determined in step S16 that the predetermined voltage detection timing has not yet been reached (step S16; No), the processing proceeds to step S16 again and enters a standby state.

If it is determined in step S16 that the predetermined voltage detection timing has been reached (step S16; Yes), the voltage applied to the solenoid 52-1 is detected by the voltage detection circuit 74.

The voltage detection circuit 74 divides the voltage applied to the solenoid 52-1 by the voltage dividing resistors and outputs the voltage detection signal SV1 corresponding to the voltage applied to the solenoid 52-1 to the controller 24 (step S17).

As a result, the controller 24 determines whether or not the voltage applied to the solenoid 52-1 corresponding to the voltage detection signal SV1 input thereto is less than or equal to a threshold voltage Vth (step S18).

In this case, the threshold voltage Vth is set to a voltage that is never reached in the normal state during the initial diagnosis processing period but is easily reached in a load short-circuit state (e.g., 0.5 volts).

If it is determined in step S18 that the voltage applied to the solenoid 52-1 corresponding to the voltage detection signal SV1 input thereto is less than or equal to the threshold voltage Vth (step S18; Yes), the controller 24 determines whether or not it has been consecutively detected a predetermined number of times that the voltage applied to the solenoid 52-1 corresponding to the voltage detection signal SV1 input thereto is less than or equal to the threshold voltage Vth (step S19). More details of load short-circuit determination processing will be described later.

Here, the predetermined number of times is set to, for example, five times, and in the case of the above-described example, since the predetermined voltage detection timing is every 10 msec, in a state where it can be deemed that the voltage applied to the solenoid 52-1 corresponding to the voltage detection signal SV1 input thereto during 50 msec is less than or equal to the threshold voltage Vth, it is determined that the solenoid 52-1, as a load, is being short-circuited, load short-circuit detection time processing is performed (step S20), and the processing is ended.

Here, as the load short-circuit detection time processing, for example, a notification (such as display or speech) that a short-circuit of a load (in this example, the solenoid) has occurred is made, and if the vehicle cannot be started, this fact is notified, and the starting processing is interrupted.

If it is determined in step S18 that the voltage applied to the solenoid 52-1 corresponding to the voltage detection signal SV1 input thereto exceeds the threshold voltage Vth (step S18; No), it is determined whether or not the initial diagnosis processing can be ended, that is, whether or not all the procedures have been completed without detecting an abnormality in the initial diagnosis (step S21).

If it is determined in step S21 that the initial diagnosis processing cannot be ended yet (step S21; No), the processing proceeds to step S16 again, and the above-described processing is repeated.

If it is determined in step S21 that the initial diagnosis processing can be ended (step S21; Yes), the processing proceeds to normal processing, and starting processing of the vehicle is performed (step S22).

Here, the load short-circuit determination processing will be described in more detail.

Figure 6:
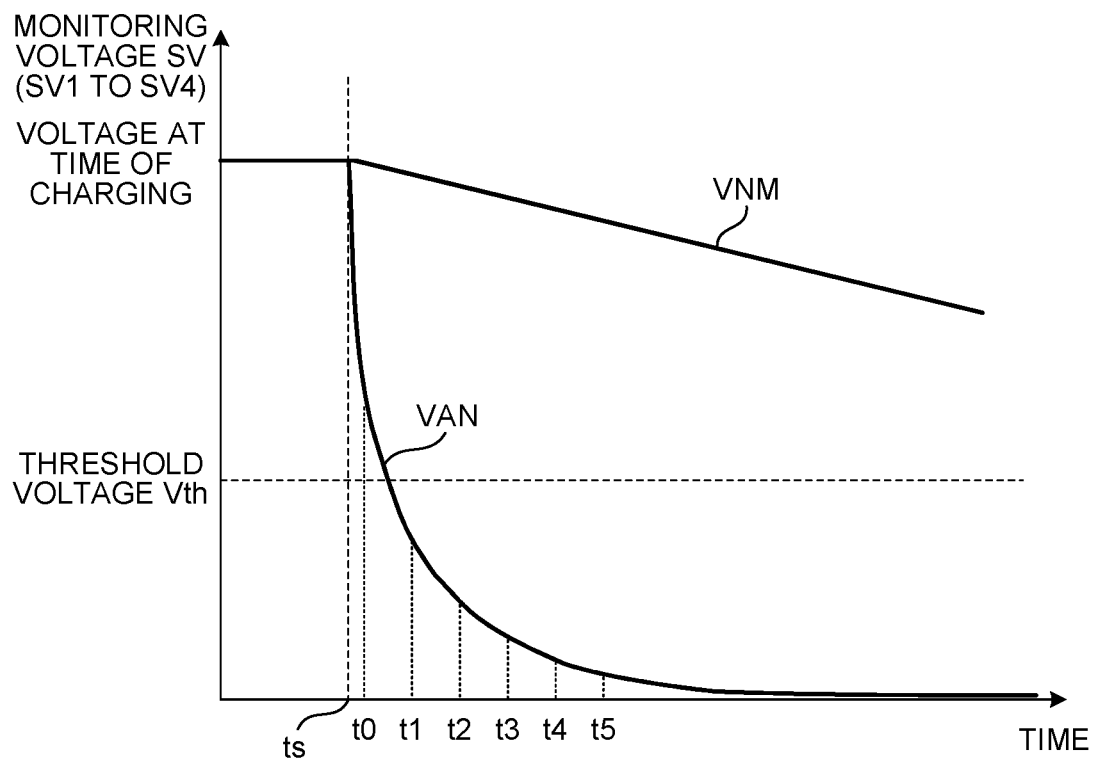
FIG. 6 is an explanatory graph of load short-circuit determination processing.

FIG. 6 is an explanatory graph of load short-circuit determination processing.

In the initial state in which charging of the electrolytic capacitor 63 is completed and both the high-side switch 62 and the low-side switch 75 are in the OFF state, a monitoring voltage SV (which corresponds to the voltage detection signals SV1 to SV4) is equivalent to the voltage of the electrolytic capacitor 63, which is equal to the voltage of the battery 51 (in FIG. 6, the voltage of the horizontal portion).

Hereinafter, to facilitate understanding, only the system of the solenoid drive unit 34-1 will be described.

Thereafter, the controller 24 outputs, to the low-side switch 75, the PWM control signal SPWM1 for driving the low-side switch 75 at the predetermined duty ratio for detecting a load short-circuit at time ts.

As a result, since the low-side switch 75 is turned on at the predetermined duty ratio corresponding to the PWM control signal SPWM1, a current flows from the electrolytic capacitor 63 through the solenoid 52-1 (or a short-circuited portion), the shunt resistor 72, and the drain terminal and the source terminal of the N-channel MOS transistor included in the low-side switch 75.

In this case, in a case where a short-circuit does not occur and the current flows through the solenoid 52-1, the current is limited by the resistance component of the solenoid 52-1, and the voltage decreases gradually as illustrated as a straight line VNM in the upper part of FIG. 6.

Therefore, during a predetermined load short-circuit detection processing period, a voltage corresponding to the voltage detection signal SV1 detected by the voltage detection circuit 74 does not become less than or equal to the threshold voltage Vth, and thus the controller 24 determines that the processing can proceed to the normal processing after the load short-circuit detection processing and performs the processing.

On the other hand, when a short-circuit is occurring, a current flows via a short-circuited portion, and the current is not limited unlike in the normal state. Therefore, as indicated by a curve VAN in the lower part of FIG. 6, the voltage drops sharply.

In this case, at time t0 which is predetermined voltage detection timing (for example, every 10 msec), the voltage applied to the solenoid 52-1 corresponding to the voltage detection signal SV1 detected by the voltage detection circuit 74 has not yet become equal to or lower than the threshold voltage Vth, and the timing to end the load short-circuit detection processing (for example, during 80 msec after the start of the load short-circuit detection processing has been started) has not yet been reached, and thus the controller 24 enters a standby state.

Then, when the controller 24 detects that the voltage applied to the solenoid 52-1 corresponding to the voltage detection signal SV1 input thereto exceeds the threshold voltage Vth, the controller 24 resets a detection number counter (not illustrated).

Then, at time t1 which is next voltage detection timing, the controller 24 detects that the voltage applied to the solenoid 52-1 corresponding to the voltage detection signal SV1 detected by the voltage detection circuit 74 is less than or equal to the threshold voltage Vth.

As a result, the controller 24 determines whether or not it has been consecutively detected a predetermined number of times (for example, five times) that the voltage applied to the solenoid 52-1 corresponding to the voltage detection signal SV1 input thereto is less than or equal to the threshold voltage Vth.

However, in this case, since it is still the first time and the timing to end the load short-circuit detection processing has not yet been reached, the controller 24 enters the standby state.

In this case, when the controller 24 detects that the voltage applied to the solenoid 52-1 corresponding to the voltage detection signal SV1 input thereto is lower than or equal to the threshold voltage Vth, the controller 24 counts up (for example, detection number counter=1) the above-described detection number counter (not illustrated) by one and holds the number.

Similarly, also at time t2, time t3, and time t4 which are voltage detection timing, the controller 24 detects that the voltage applied to the solenoid 52-1 corresponding to the voltage detection signal SV1 detected by the voltage detection circuit 74 is lower than or equal to the threshold voltage Vth and determines whether or not it has been consecutively detected a predetermined number of times (for example, five times) that the voltage applied to the solenoid 52-1 corresponding to the voltage detection signal SV1 input thereto is lower than or equal to the threshold voltage Vth.

However, in these cases, since it is still the second to fourth time and the timing to end the load short-circuit detection processing has not yet been reached, the controller 24 enters the standby state. In this state, the above-described detection number counter (not illustrated) is counted up (for example, detection number counter=2→4) one by one, and the number is held.

Then, at time t5 which is next voltage detection timing, the controller 24 detects that the voltage applied to the solenoid 52-1 corresponding to the voltage detection signal SV1 detected by the voltage detection circuit 74 is less than or equal to the threshold voltage Vth.

As a result, the controller 24 determines whether or not it has been consecutively detected a predetermined number of times (for example, five times) that the voltage applied to the solenoid 52-1 corresponding to the voltage detection signal SV1 input thereto is less than or equal to the threshold voltage Vth.

In this case, since it has been consecutively detected for the predetermined number of times (in this example, five times) that the voltage applied to the solenoid 52-1 corresponding to the voltage detection signal SV1 input thereto is less than or equal to the threshold voltage Vth, the controller 24 determines that the solenoid 52-1, as a load, is being short-circuited and performs the load short-circuit detection time processing since the voltage applied to the solenoid 52-1 corresponding to the voltage detection signal SV1 input thereto can be deemed as being less than or equal to the threshold voltage Vth during the predetermined period (50 msec in this example).

As described above, according to the present embodiment, in a state in which electric power is stored in the electrolytic capacitor 63 and the electrolytic capacitor is electrically disconnected from the battery 51, the low-side switch 75 is PWM-controlled at a predetermined duty ratio, and a state in which the voltage applied to the solenoid 52-1 corresponding to the voltage detection signal SV1 having been input is lower than or equal to the threshold voltage Vth has been consecutively detected a predetermined number of times during the load short-circuit detection processing period, and as a result, a load short-circuit can be reliably detected.

Furthermore, according to the present embodiment, since the current flowing from the electrolytic capacitor 63, as power supply, to the ground is limited in the load short-circuit detection processing, it is possible to reliably perform short-circuit detection while protecting circuit components (such as wiring (harness), shunt resistors, MOS transistors, and the controller) that may be included in a current flow path through which a short-circuit current flows.

Although the embodiments of the present disclosure have been described above, the present disclosure is not limited to the above-described embodiments, and various modifications can be made without departing from the gist of the present invention.

For example, in the above description, the case where a load short-circuit is detected for the solenoid drive unit 64-1 among the solenoid drive units 64-1 to 64-4 has been described; however, when the load short-circuit detection processing is performed for the plurality of solenoid drive units 64-1 to 64-4, it is only required that each electrolytic capacitor 63 be charged in the load short-circuit detection processing for each of the solenoid drive units 64-1 to 64-4 and that the load short-circuit detection processing be performed using the same threshold voltage Vth.

It is also possible to set different threshold voltages Vth for each of the solenoid drive units 64-1 to 64-4 (the threshold voltage Vth is made lower for a solenoid drive unit to be processed later) and to set a predetermined duty ratio smaller than that in the above description, thereby extending the dischargeable period of the electrolytic capacitor 63 and sequentially performing the load short-circuit detection processing in all the solenoid drive units 64-1 to 64-4 at one time of charging of the electrolytic capacitor 63.

In the above description, a load short-circuit is detected in a case where the voltage detection is performed at every predetermined timing and the voltage is consecutively lower than the threshold voltage Vth a predetermined number of times. However, it is also possible to determine that a load short-circuit is detected in a case where the voltage detection is continuously performed for a predetermined period of time and the voltage is lower than the threshold voltage Vth for a predetermined period of time or longer.

In the above description, the system for improving the ride comfort by keeping the posture of the vehicle constant using the solenoids has been described. However, it is also possible to perform the load short-circuit detection in a similar manner in a system in which a vehicle body is kept horizontal by predicting the turning situation of the vehicle and controlling the damping force of shock absorbers using steering information used in steer-by-wire technology and thereby controlling the damping force before the vehicle starts turning and tilts upon operation of the steering wheel, thereby obtaining the same effect as the improvement in the body rigidity at the time of rolling.

In the above description, the case where the load is solenoids (coils) has been described. However, the present invention can be similarly applied to a device in which the amount of current is limited by a load during normal operation, the amount of current flowing through the load can be controlled by PWM control, and the amount of current is not limited by the load during short-circuit.

According to the present disclosure, it is possible to reliably detect a load short-circuit and to protect components that may be located in a flow path through which a short-circuit current flows.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A load short-circuit detection method executed in a load drive device comprising:
    a power storage element that stores electric power for driving a load;
    a first switch that is connected to a low-potential side of the load and controls a current flowing through the load;
    a second switch that is connected to a high-potential side of the power storage element and connects the power storage element to a high-potential side power supply; and
    a voltage detection circuit that detects a voltage of a current flow path flowing from the power storage element to a low-potential side power supply via the first switch, the load short-circuit detection method comprising:
    PWM-driving the first switch at a predetermined duty ratio;
    detecting that the load is being short-circuited in a case where a state in which the voltage of the current flow path detected by the voltage detection circuit is lower than or equal to a predetermined threshold voltage continues for a predetermined period of time or longer; and
    storing the electric power by connecting the power storage element to the high-potential side power supply by turning on the second switch while the first switch is tuned off, prior to the PWM-driving.

2. The load short-circuit detection method according to claim 1, wherein
    whether or not the voltage of the current flow path is lower than or equal to the predetermined threshold voltage is determined intermittently at predetermined time intervals, and
    at the detecting as being short-circuited, it is detected that the load is being short-circuited in a case where a state in which the voltage of the current flow path is lower than or equal to the predetermined threshold voltage is consecutively detected a predetermined number of times.

3. The load short-circuit detection method according to claim 1, wherein the predetermined duty ratio is set to 50 percent or less, more preferably, 50 percent or less and 5 percent or more.

4. A load short-circuit detection device comprising:
    a power storage element that stores electric power for driving a load;
    a first switch that is connected to a low-potential side of the load, is controlled by a first control signal, is PWM-driven at a predetermined duty ratio, and controls a current flowing through the load;
    a second switch that is controlled by a second control signal, is connected to a high-potential side of the power storage element, and connects the power storage element to a high-potential side power supply;
    a voltage detection circuit that detects a voltage of a current flow path flowing from the power storage element to a low-potential side power supply via the first switch and outputs a voltage detection signal; and
    a controller that outputs the first control signal and detects that the load is being short-circuited in a case where it is determined that a state in which the voltage of the current flow path is lower than or equal to a predetermined threshold voltage has continued for a predetermined period of time or longer based on the voltage detection signal,
    wherein prior to the PWM driving, the controller stores the electric power by turning off the first switch by the first control signal and turning on the second switch by the second control signal to connect the power storage element to the high-potential side power supply.

5. The load short-circuit detection device according to claim 4, wherein the controller intermittently performs processing of detecting the voltage of the current flow path based on the voltage detection signal at predetermined time intervals and detects that the load is being short-circuited in a case where the state in which the voltage of the current flow path is lower than or equal to the predetermined threshold voltage is consecutively detected a predetermined number of times.

6. The load short-circuit detection device according to claim 4, wherein the predetermined duty ratio is set to 50 percent or less, more preferably, 50 percent or less and 5 percent or more.

* * * * *